United States Patent
Hersam et al.

(10) Patent No.: US 8,562,905 B2
(45) Date of Patent: Oct. 22, 2013

(54) MULTIFUNCTIONAL NANOCOMPOSITES OF CARBON NANOTUBES AND NANOPARTICLES FORMED VIA VACUUM FILTRATION

(75) Inventors: Mark C. Hersam, Wilmette, IL (US); Gordana Ostojic, Evanston, IL (US); Yu Teng Liang, Chicago, IL (US)

(73) Assignee: Northwestern University, Evanston, IL (US)

( * ) Notice: Subject to any disclaimer, the term of this patent is extended or adjusted under 35 U.S.C. 154(b) by 418 days.

(21) Appl. No.: 12/877,602

(22) Filed: Sep. 8, 2010

(65) Prior Publication Data

US 2011/0171531 A1  Jul. 14, 2011

Related U.S. Application Data

(60) Provisional application No. 61/240,466, filed on Sep. 8, 2009.

(51) Int. Cl.
*B22F 3/20* (2006.01)
*C12N 11/14* (2006.01)
*B01J 20/22* (2006.01)
*C09K 11/02* (2006.01)
*H01B 1/24* (2006.01)

(52) U.S. Cl.
USPC ........ 419/61; 435/176; 502/403; 252/301.36; 252/506; 977/742; 977/750; 977/752; 977/773

(58) Field of Classification Search
USPC .......................................................... 419/61
See application file for complete search history.

(56) References Cited

U.S. PATENT DOCUMENTS

| 2007/0065977 | A1* | 3/2007 | Rinzler et al. | 438/99 |
| 2008/0217588 | A1* | 9/2008 | Arnold et al. | 252/502 |
| 2009/0266580 | A1* | 10/2009 | Jung et al. | 174/126.2 |
| 2010/0173376 | A1* | 7/2010 | Ostojic et al. | 435/176 |

OTHER PUBLICATIONS

Pedro Gomez-Romero, Hybrid Organic-Inorganic Materials—In Search of Synergic Activity, Advanced Materials, Feb. 5, 2001, p. 163-174, vol. 13, No. 3.
Sung Jin Kim et al., Defect-induced Loading of Pt nanoparticles on carbon nanotubes, Applied Physics Letters, 2007, p. 023114-1-3, vol. 90.
Jayasri Narayanamoorthy et al., Tenfold catalytic activity enhancement of Pt/C by doping with single walled carbon nanotube for methanol oxidation, Applied Physics Letters, 2007, p. 063112-1-3, vol. 90.
M. Kaempgen et al., Multifunctional carbon nanotube networks for fuel cells, Applied Physics Letters, 2008, 094103-1-3, vol. 92.

(Continued)

*Primary Examiner* — Roy King
*Assistant Examiner* — Christopher Kessler
(74) *Attorney, Agent, or Firm* — Morris, Manning & Martin, LLP; Tim Tingkang Xia, Esq.

(57) ABSTRACT

In one aspect, the present invention provides a method of forming a film of nanocomposites of carbon nanotubes (CNTs) and platinum (Pt) nanoparticles. In one embodiment, the method includes the steps of (a) providing a first solution that contains a plurality of CNTs, (b) providing a second solution that contains a plurality of Pt nanoparticles, (c) combining the first solution and the second solution to form a third solution, and (d) filtering the third solution through a nanoporous membrane using vacuum filtration to obtain a film of nanocomposites of CNTs and Pt nanoparticles.

18 Claims, 10 Drawing Sheets

(56) References Cited

OTHER PUBLICATIONS

H. Tang et al., High dispersion and electrocatalytic properties of platinum on well-aligned carbon nanotube arrays, Carbon, 2004, 191-197, vol. 42.

Yan-Li Yao et al., Two-step pyrolysis process to synthesize highly dispersed Pt—Ru/carbon nanotube catalysts for methanol electrooxidation, Carbon, 2006, p. 61-66, vol. 44.

Taketoshi Matsumoto et al., Reduction of Pt usage in fuel cell electrocatalysts with carbon nanotube electrodes, Chem. Commun., 2004, p. 840-841.

S.G. Chou et al., Optical characterization of DNA-wrapped carbon nanotube hybrids, Chemical Physics Letters, 2004, p. 296-301, vol. 397.

C. Bittencourt et al., Platinum-carbon nanotube interaction, Chemical Physics Letters, 2008, p. 260-264, vol. 462.

Kunchan Lee et al., Progress in the synthesis of carbon nanotube- and nanofiber-supported Pt electrocatalysts for PEM fuel cell catalysis, Journal of Applied Electrochemistry, 2006, p. 507-522, vol. 36.

Yong-Tae Kim et al., Surface thiolation of carbon nanotubes as supports: A promising route for the high dispersion of Pt nanoparticles for electrocatalysts, Journal of Catalysis, 2006, p. 394-401, vol. 238.

Michael Grätzel et al., Mesoscopic Solar Cells for Electricity and Hydrogen Production from Sunlight, Chemistry Letters, 2005, p. 8-13, vol. 34, No. 1.

Dao-Jun Guo et al., High dispersion and electrocatalytic properties of Pt nanoparticles on SWNT bundles, Journal of Electroanalytical Chemistry, 2004, p. 197-202, vol. 573.

Wenzhen Li et al., Preparation and Characterization of Multiwalled Carbon Nanotube-Supported Platinum for Cathode Catalysts of Direct Methanol Fuel Cells, J. Phys. Chem. B, 2003, p. 6292-6299, vol. 107, No. 26.

Yangchuan Xing, Synthesis and Electrochemical Characterization of Uniformly-Dispersed High Loading Pt Nanoparticles on Sonochemically-Treated Carbon Nanotubes, J. Phys. Chem. B, 2004, p. 19255-19259, vol. 108, No. 50.

Yongyan Mu et al., Controllable Pt Nanoparticle Deposition on Carbon Nanotubes as an Anode Catalyst for Direct Methanol Fuel Cells, J. Phys. Chem. B, 2005, p. 22212-22216, vol. 109, No. 47.

G. Girishkumar et al., Single Wall Carbon Nanotube Supports for Portable Direct Methanol Fuel Cells, J. Phys. Chem. B, 2006, p. 107-114, vol. 110, No. 1.

Zhi Qun Tian et al., Synthesis and Characterization of Platinum Catalysts on Multiwalled Carbon Nanotubes by Intermittent Microwave Irradiation for Fuel Cell Applications, J. Phys. Chem. B, 2006, p. 5343-5350, vol. 110, No. 11.

Anusorn Kongkanand et al., Highly Dispersed Pt Catalysts on Single-Walled Carbon Nanotubes and Their Role in Methanol Oxidation, The Journal of Physical Chemistry B, 2006, p. 16185-16188, vol. 110, No. 33.

Prashant V. Kamat et al., Meeting the Clean Energy Demand: Nanostructure Architectures for Solar Energy Conversion, J. Phys. Chem. C, 2007, p. 2834-2860, vol. 111, No. 7.

Hansan Liu et al., A review of anode catalysis in the direct methanol fuel cell, Journal of Power Sources, 2006, p. 95-110, vol. 155.

Lorraine C. Nagle et al., Aligned carbon nanotube-Pt composite fuel cell catalyst by template electrodeposition, Journal of Power Sources, 2008, p. 411-418, vol. 185.

Thomas M. Day et al., Electrochemical Templating of metal Nanoparticles and Nanowires on Single-Walled Carbon Nanotube Networks, J. Am. Chem. Soc., 2005, p. 10639-10647, vol. 127, No. 30.

G. Girishkumar et al., Single-Wall Carbon Nanotube-Based Proton Exchange Membrane Assembly for Hydrogen Fuel Cells, Langmuir, 2005, p. 8487-8494, vol. 21, No. 18.

Yuehe Lin et al., PtRu/Carbon Nanotube Nanocomposite synthesized in Supercritical Fluid: A Novel Electrocatalyst for Direct Methanol Fuel Cells, Langmuir, 2005, p. 11474-11479, vol. 21, No. 24.

Gordana N. Ostojic et al., Noncovalent Functionalization of DNA-Wrapped Single-Walled Carbon nanotubes with Platinum-Based DNA Cross-Linkers, Langmuir, 2008, p. 9784-9789, vol. 24, No. 17.

Cheng Wang et al., Proton Exchange membrane Fuel Cells with Carbon Nanotube Based Electrodes, Nano Letters, 2004, p. 345-348, vol. 4, No. 2.

Thomas M. Day et al., Factors Controlling the Electrodeposition of metal Nanoparticles on Pristine Single Walled Carbon Nanotubes, Nano Letters, 2007, p. 51-57, vol. 7, No. 1.

Alexander A. Green at al., Colored Semitransparent Conductive Coatings Consisting of Monodisperse Metallic Single-Walled Carbon Nanotubes, Nano Letters, 2008, p. 1417-1422, vol. 8, No. 5.

Guoqiang Ren et al., Deposition of metallic nanoparticles on carbon nanotubes via a fast evaporation process, Nanotechnology, 2006, p. 5596-5601, vol. 17.

Brian O'Regan et al., A low-cost, high-efficiency solar cell based on dye-sensitized colloidal $TiO_2$ films, Nature, Oct. 24, 1991, p. 737-740, vol. 353.

P. A. Sundqvist et al., Electronic transport in carbon nanotubes: Diffusive and localized regimes, Physical Review B, 2008, p. 205427-1-5, vol. 78.

Khoi T. Nguyen et al., Fano Lineshape and Phonon Softening in Single Isolated Metallic Carbon Nanotubes, Physical Review Letters, 2007, p. 145504-1-4, vol. 98.

Anindya Das et al., Doping in Carbon Nanotubes Probed by Raman and Transport Measurements, Physical Review Letters, 2007, p. 136803-1-4, vol. 99.

Nathan S. Lewis et al., Powering the planet: Chemical challenges in solar energy utilization, PNAS, Oct. 24, 2006, p. 15729-15735, vol. 103, No. 43.

Michael J. O'Connell et al., Band Gap Fluorescence from Individual Single-Walled Carbon Nanotubes, Jul. 26, 2002, Science, vol. 297.

* cited by examiner

MULTIFUNCTIONAL NANOCOMPOSITES OF CARBON NANOTUBES AND NANOPARTICLES FORMED VIA VACUUM FILTRATION

CROSS-REFERENCE

This application claims the benefit, pursuant to 35 U.S.C. §119(e), of U.S. provisional patent application Ser. No. 61/240,466, filed Sep. 8, 2009, entitled "MULTIFUNCTIONAL NANOCOMPOSITES OF CARBON NANOTUBES AND NANOPARTICLES FORMED VIA VACUUM FILTRATION," by M. C. Hersam, G. Ostojic, and Y. T. Liang, which is incorporated herein by reference in its entirety.

Some references, which may include patents, patent applications and various publications, are cited and discussed in the description of this invention. The citation and/or discussion of such references is provided merely to clarify the description of the present invention and is not an admission that any such reference is "prior art" to the invention described herein. All references cited and discussed in this specification are incorporated herein by reference in their entireties and to the same extent as if each reference was individually incorporated by reference. In terms of notation, hereinafter, "[n]" represents the 34th reference cited in the reference list. For example, "[34]" represents the 34th reference cited in the reference list, namely, [34], Green A A and Hersam M C 2008 *Nano Lett.* 8 1417.

STATEMENT OF FEDERALLY-SPONSORED RESEARCH

This invention was made with government support under Grant No. DE-FG02-03ER15457 awarded by the Department of Energy. The government has certain rights in the invention.

FIELD OF THE INVENTION

The present invention relates generally to nanotubes and nanoparticles, more particularly to nanocomposites of carbon nanotubes and nanoparticles formed via vacuum filtration.

BACKGROUND

The pressing need for clean and renewable energy sources has inspired significant research focused on the improvement of photovoltaics, batteries, and catalysts [1]. Due to their inherently large surface area and manufacturability, nanomaterials have received specific attention for these alternative energy applications [2-4]. For example, the photoactive electrode in dye sensitized solar cells (DSSC) employs titanium dioxide nanoparticles, leading to 10% device efficiency with relatively simple processing [5]. Further improvements have been realized by combining multiple nanomaterials in nanocomposite films. In particular, because of their high electrical conductivity, excellent chemical and mechanical stability, and large surface area, carbon nanotubes show promise as electrodes and catalyst supports [6-23]. The combination of carbon nanotubes and platinum nanoparticles has been especially successful for fuel cell applications, where multifold efficiency improvements have already been demonstrated [24].

Many strategies for decorating carbon nanotubes with platinum nanoparticles have been previously developed. Solution and supercritical liquid functionalization [14] schemes have the advantage of exploiting the entire carbon nanotube surface, although it is necessary to maintain well dispersed carbon nanotubes during the platinum nanoparticle attachment and growth in order to obtain complete surface coverage. For example, covalent attachment of platinum has been achieved by chemical functionalization of the carbon nanotube surface [12]. In this approach, metal precursors covalently bind to carbon nanotube defects and are then chemically reduced to form platinum nanoparticles [6, 22, 25]. In addition, solution-based, noncovalent deposition procedures have been developed where perturbation of the carbon nanotube surface is minimized because the platinum is grown on a polymer that noncovalently encapsulates the nanotube [26, 27]. Surface deposition methods such as electrodeposition [11, 28, 29], evaporation [30], and pyrolysis [23], have also been employed to form platinum nanoparticles on carbon nanotube thin films. In select cases, these surface methods have also yielded platinum deposition selectively at carbon nanotube defect sites [31, 32]. While surface deposition schemes possess some processing advantages compared to solution-phase techniques; however, they typically result in only the top surface of the carbon nanotube film being decorated with platinum nanoparticles.

Therefore, a heretofore unaddressed need exists in the art to address the aforementioned deficiencies and inadequacies.

SUMMARY OF THE INVENTION

In one aspect, the present invention provides a method of forming a film of nanocomposites of carbon nanotubes (CNTs) and platinum (Pt) nanoparticles. In one embodiment, the method includes the steps of (a) providing a first solution that contains a plurality of CNTs, (b) providing a second solution that contains a plurality of Pt nanoparticles, (c) combining the first solution and the second solution to form a third solution, and (d) filtering the third solution through a nanoporous membrane using vacuum filtration to obtain a film of nanocomposites of CNTs and Pt nanoparticles.

In one embodiment, the method further includes the step of rinsing the film of nanocomposites of CNTs and Pt nanoparticles with water after the filtering step.

In one embodiment, the third solution is diluted with 0.5% sodium cholate prior to the filtering step.

In one embodiment, the nanoporous membrane is a mixed cellulose ester (MCE) membrane.

In one embodiment, the MCE membrane has a pore size of about 50 nm.

In one embodiment, the nanoporous membrane is an anodized alumina membrane.

In one embodiment, the anodized alumina membrane has a pore size of about 20 nm.

In one embodiment, the plurality of CNTs comprises single-walled carbon nanotubes (SWNTs).

In one embodiment, the SWNTs have (6,5) chirality and have a diameter of about 0.76 nm.

In one embodiment, the first solution comprises CNTs dispersed in 1% sodium dodecyl sulfate (SDS).

In one embodiment, the step of providing the second solution includes the steps of (a) dispersing a first amount of potassium tetrachloroplatinate ($K_2PtCl_4$) in 0.2% SDS to form a fourth solution, and (b) reducing the first amount of $K_2PtCl_4$ in the fourth solution with a second amount of (dimethylamino)borane (DMAB) to form the plurality of Pt nanoparticles.

In one embodiment, the fourth solution is aged for about one day prior to the reducing step.

In one embodiment, the molar ratio of the first amount of $K_2PtCl_4$ and the second amount of DMAB is about 1:100.

In one embodiment, the reducing step includes pipetting about five aliquots of DMAB every one minute into the fourth solution while stirring the fourth solution continuously at room temperature.

In one embodiment, the film of nanocomposites of CNTs and Pt nanoparticles includes Pt nanoparticles of about 4.8 nm diameter. In one embodiment, the film of nanocomposites of CNTs and Pt nanoparticles has a Pt concentration ranging from about 0.05 µmol to about 1 µmol.

In another embodiment, the film of nanocomposites of CNTs and Pt nanoparticles has a Pt concentration of about 0.8 µmol and an inter-Pt-nanoparticle spacing that is less than about 50 nm.

In yet another embodiment, the film of nanocomposites of CNTs and Pt nanoparticles has an average electrochemically active Pt surface area per gram of about 23.6 $m^2/g$.

In a further embodiment, about 42% of the Pt nanoparticle surface area in the film of nanocomposites of CNTs and Pt nanoparticles is electrochemically active.

In another aspect, the present invention provides an article of manufacture made by the method set forth immediately above.

In another aspect, the present invention provides a dye-sensitized solar cell. In one embodiment, the dye-sensitized solar cell includes (a) an anode, (b) a cathode comprising a film of nanocomposites of CNTs and Pt nanoparticles made by the method set forth immediately above, and (c) an active layer disposed between the anode and the cathode and immersed in an electrolyte solution, the active layer comprising porous titanium dioxide covered with photosensitive dye.

In yet another aspect, the present invention provides a method of forming a film of nanocomposites of CNTs and TiO2 nanoparticles. In one embodiment, the method includes the steps of (a) combining a first solution that contains a plurality of carbon nanotubes (CNTs) and a second solution that contains a plurality of titanium dioxide ($TiO_2$) nanoparticles to form a third solution, and (b) filtering the third solution through a nanoporous membrane using vacuum filtration to obtain a film of nanocomposites of CNTs and $TiO_2$ nanoparticles.

In one embodiment, the plurality of CNTs comprises single-walled carbon nanotubes (SWNTs).

In one embodiment, the plurality of $TiO_2$ nanoparticles comprises substantially spherical $TiO_2$ nanoparticles in the form of anatase, or substantially cylindrical $TiO_2$ nanoparticles in the form of rutile, or a combination thereof.

In one embodiment, the substantially spherical $TiO_2$ nanoparticles have a diameter of about 25 nm, and the substantially cylindrical $TiO_2$ nanoparticles have a diameter of about 40 nm and a length of about 100 nm.

In one embodiment, the first solution comprises CNTs dispersed in sodium dodecyl sulfate (SDS) with a density of about 0.5 mg/ml, and the second solution comprises $TiO_2$ nanoparticles dispersed in SDS with a density of about 1 mg/ml.

In one embodiment, the mass ratio of $TiO_2$ to CNTs is about 5:1.

In another embodiment, the nanoporous membrane is an anodized alumina membrane.

In yet another embodiment, the anodized alumina membrane has a pore size of about 200 nm.

In a further embodiment, the film of nanocomposites of CNTs and $TiO_2$ nanoparticles is electrically conductive.

In another aspect, the present invention provides an article of manufacture made by the method set forth immediately above.

In a further aspect, the present invention provides a method of forming a film of nanocomposites of silicon (Si)-graphene-CNT. In one embodiment, the method includes the steps of (a) combining a first solution that contains a plurality of Si nanoparticles, a second solution that contains a plurality of graphene sheets, and a third solution that contains a plurality of carbon nanotubes (CNTs), to form a fourth solution, and (b) filtering the fourth solution through a nanoporous membrane using vacuum filtration to obtain a film of nanocomposites of Si-graphene-CNT.

In one embodiment, the mass ratio of Si-graphene-CNT is about 40:10:1.

In one embodiment, the plurality of CNTs comprises single-walled carbon nanotubes (SWNTs).

In one embodiment, the membrane is an anodized alumina membrane.

In another embodiment, the anodized alumina membrane has a pore size of about 200 nm.

In yet another embodiment, the film of nanocomposites of Si-graphene-CNT comprises Si nanoparticles of an average size of about 26 nm.

In a further embodiment, the first solution comprises Si nanoparticles dispersed in sodium dodecyl sulfate (SDS) via ball milling with a density of about 0.2 mg/mL, the second solution comprises graphene sheets dispersed in N,N dimethyl formamide, and the third solution comprises SWNTs dispersed in dimethyl formamide.

In another aspect, the present invention provides an article of manufacture made by the method set forth immediately above.

In another aspect, the present invention provides a lithium-ion battery cell. The lithium-ion battery cell includes (a) an anode comprising a film of nanocomposites of Si-graphene-CNT made by the method of claim 32, (b) a cathode, and (c) an electrolyte.

In yet another aspect, the present invention provides a method of forming a film of nanocomposites of CNTs and non-carbon nanoparticles. In one embodiment, the method includes the steps of (a) combining a first solution that contains a plurality of carbon nanotubes (CNTs) and a second sollution that contains a plurality of non-carbon nanoparticles to form a third solution, and (b) filtering the third solution through a nanoporous membrane using vacuum filtration to obtain a film of nanocomposites of CNTs and non-carbon nanoparticles.

In one embodiment, the plurality of CNTs comprises single-walled carbon nanotubes (SWNTs).

In one embodiment, the plurality of non-carbon nanoparticles comprises semiconductor nanoparticles.

In one embodiment, the semiconductor nanoparticles comprise silicon (Si) nanoparticles.

In one embodiment, the plurality of non-carbon nanoparticles comprises metal nanoparticles.

In one embodiment, the metal nanoparticles comprise platinum (Pt) nanoparticles.

In another embodiment, the plurality of non-carbon nanoparticles comprises metal-oxide nanoparticles.

In yet another embodiment, the metal-oxide nanoparticles comprise $TiO_2$ nanoparticles.

In a further embodiment, the plurality of $TiO_2$ nanoparticles comprises substantially spherical $TiO_2$ nanoparticles in the form of anatase, or substantially cylindrical $TiO_2$ nanoparticles in the form of rutile, or a combination thereof.

In a further aspect, the present invention provides an article of manufacture comprising a film of nanocomposites of CNTs and non-carbon nanoparticles made by the method set forth immediately above.

One example of such an article of manufacture is a fuel cell that includes an anode having a film of nanocomposites of CNTs and metal, such as Pt, nanoparticles made by a method according to one embodiment of the present invention, a cathode, and an electrolyte.

These and other aspects of the present invention will become apparent from the following description of the preferred embodiment taken in conjunction with the following drawings, although variations and modifications therein may be affected without departing from the spirit and scope of the novel concepts of the disclosure.

BRIEF DESCRIPTION OF THE DRAWINGS

FIG. 4 shows Raman scattering spectra of (a) SWNT and SWNT/Pt (0.8 μmol) films according to one embodiment of the present invention, and (b) aqueous dispersions, obtained by laser excitation at 568.2 nm (CPS=counts per second). The $G^+$ longitudinal and $G^-$ transverse vibrational bands for both metallic and semiconducting SWNTs are labeled. The spectra are normalized to the $G_S^+$ peak. The increase of the $G_M^+$ amplitude and the broadening of the $G_S^+$ peak for the SWNT/Pt nanocomposite films are noted by arrows. The $G_S^+$ mode in (c) nanocomposite SWNT/Pt (0.8 μmol) films according to one embodiment of the present invention, and (d) SWNT films is monitored before and after exposure to 5% hydrogen gas. The shift towards higher wavenumbers for the SWNT/Pt nanocomposite is illustrated by the arrow.

DETAILED DESCRIPTION

The present invention is more particularly described in the following examples that are intended as illustrative only since numerous modifications and variations therein will be apparent to those skilled in the art. Various embodiments of the invention are now described in detail. Referring to the drawings, FIGS. 1-10, like numbers, if any, indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise. Moreover, titles or subtitles may be used in the specification for the convenience of a reader, which shall have no influence on the scope of the present invention. Additionally, some terms used in this specification are more specifically defined below.

Definitions

The terms used in this specification generally have their ordinary meanings in the art, within the context of the invention, and in the specific context where each term is used. Certain terms that are used to describe the invention are discussed below, or elsewhere in the specification, to provide additional guidance to the practitioner regarding the description of the invention. For convenience, certain terms may be highlighted, for example using italics and/or quotation marks. The use of highlighting has no influence on the scope and meaning of a term; the scope and meaning of a term is the same, in the same context, whether or not it is highlighted. It will be appreciated that same thing can be said in more than one way. Consequently, alternative language and synonyms may be used for any one or more of the terms discussed herein, nor is any special significance to be placed upon whether or not a term is elaborated or discussed herein. Synonyms for certain terms are provided. A recital of one or more synonyms does not exclude the use of other synonyms. The use of examples anywhere in this specification including examples of any terms discussed herein is illustrative only, and in no way limits the scope and meaning of the invention or of any exemplified term. Likewise, the invention is not limited to various embodiments given in this specification.

Unless otherwise defined, all technical and scientific terms used herein have the same meaning as commonly understood by one of ordinary skill in the art to which this invention pertains. In the case of conflict, the present document, including definitions will control.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, the term "X-ray diffraction (XRD)" refers to one of X-ray scattering techniques that are a family of non-destructive analytical techniques which reveal information about the crystallographic structure, chemical composition, and physical properties of materials and thin films. These techniques are based on observing the scattered intensity of an X-ray beam hitting a sample as a function of incident and scattered angle, polarization, and wavelength or energy. In particular, X-ray diffraction finds the geometry or shape of a molecule, compound, or material using X-rays. X-ray diffraction techniques are based on the elastic scattering of X-rays from structures that have long range order. The most comprehensive description of scattering from crystals is given by the dynamical theory of diffraction.

As used herein, if any, the term "scanning electron microscope (SEM)" refers to a type of electron microscope that images the sample surface by scanning it with a high-energy beam of electrons in a raster scan pattern. The electrons interact with the atoms that make up the sample producing signals that contain information about the sample's surface topography, composition and other properties such as electrical conductivity.

As used herein, the term "Raman spectroscopy" or "Raman technique" refers to an optical technique that probes the specific molecular content of a sample by collecting in-elastically scattered light. As photons propagate through a medium, they undergo both absorptive and scattering events. In absorption, the energy of the photons is completely transferred to the material, allowing either heat transfer (internal conversion) or re-emission phenomena such as fluorescence and phosphorescence to occur. Scattering, however, is normally an in-elastic process, in which the incident photons retain their energy. In Raman scattering, the photons either donate or acquire energy from the medium, on a molecular level. In contrast to fluorescence, where the energy transfers are on the order of the electronic bandgaps, the energy transfers associated with Raman scattering are on the order of the vibrational modes of the molecule. These vibrational modes are molecularly specific, giving every molecule a unique Raman spectral signature.

Raman scattering is a very weak phenomena, and therefore practical measurement of Raman spectra of a medium requires high power excitation laser sources and extremely sensitive detection hardware. Even with these components, the Raman spectra from tissue are masked by the relatively intense tissue auto-fluorescence. After detection, post processing techniques are required to subtract the fluorescent background and enable accurate visualization of the Raman spectra. Raman spectra are plotted as a function of frequency shift in units of wavenumber ($cm^{-1}$). The region of the Raman spectra where most biological molecules have Raman peaks is from 500 to 2000 $cm^{-1}$. In contrast to fluorescence spectra, Raman spectra have sharp spectral features that enable easier identification of the constituent sources of spectral peaks in a complex sample.

As used herein, if any, the term "optical spectroscopy" refers to spectroscopic techniques that measure the absorption (or the transmission) of radiation, as a function of frequency or wavelength, due to its interaction with a sample. The sample absorbs energy, i.e., photons, from the radiating field. The intensity of the absorption (or transmission) varies as a function of frequency, and this variation is the absorption (or transmission) spectrum. Absorption (or transmission) spectroscopy is employed as an analytical chemistry tool to determine the presence of a particular substance in a sample and, in many cases, to quantify the amount of the substance present. Infrared and ultraviolet-visible (UV-Vis) spectroscopy are particularly common in analytical applications. The term "infrared spectroscopy" refers to absorption (or transmission) spectroscopy in the infrared spectral region; and the term "ultraviolet-visible (UV-Vis) spectroscopy" refers to absorption (or transmission) spectroscopy in the ultraviolet-visible spectral region.

As used herein, if any, the term "four-point probe" technique refers to an electrical conductivity (or impedance) measuring technique that uses separate pairs of current-carrying and voltage-sensing electrodes to make more accurate measurements than traditional two-terminal sensing. Four-point probes are also used to measure sheet resistance of thin films.

As used herein, if any, the term "cyclic voltammetry" refers to a type of potentiodynamic electrochemical measurement. In a cyclic voltammetry experiment the working electrode potential is ramped linearly versus time like linear sweep voltammetry. Cyclic voltammetry takes the experiment a step further than linear sweep voltammetry which ends when it reaches a set potential. When cyclic voltammetry reaches a set potential, the working electrode's potential ramp is inverted. This inversion can happen multiple times during a single experiment. The current at the working electrode is plotted versus the applied voltage to give the cyclic voltammogram trace. Cyclic voltammetry is generally used to study the electrochemical properties of an analyte in solution.

As used herein, "nanoscopic-scale," "nanoscopic," "nanometer-scale," "nanoscale," "nanocomposites," "nanoparticles," the "nano-" prefix, and the like generally refers to elements or articles having widths or diameters of less than about 1 µm, preferably less than about 100 nm in some cases. In all embodiments, specified widths can be smallest width (i.e. a width as specified where, at that location, the article can have a larger width in a different dimension), or largest width (i.e. where, at that location, the article's width is no wider than as specified, but can have a length that is greater).

As used herein, "carbon nanostructures" refer to carbon fibers or carbon nanotubes that have a diameter of 1 µm or smaller which is finer than that of carbon fibers. However, there is no particularly definite boundary between carbon fibers and carbon nanotubes. By a narrow definition, the material whose carbon faces with hexagon meshes are almost parallel to the axis of the corresponding carbon tube is called a carbon nanotube, and even a variant of the carbon nanotube, around which amorphous carbon exists, is included in the carbon nanotube.

As used herein, "plurality" means two or more.

As used herein, the terms "comprising," "including," "carrying," "having," "containing," "involving," and the like are to be understood to be open-ended, i.e., to mean including but not limited to.

EXAMPLES

Aspects of the present teachings may be further understood in light of the following examples, which should not be construed as limiting the scope of the present teachings in any way.

Example 1

Platinum-CNT Nanocomposites

In one embodiment of the present invention, it is demonstrated an alternative method for producing nanocomposite films of single-walled carbon nanotubes (SWNTs) and platinum nanoparticles. In this embodiment, SWNTs and platinum nanoparticles are concurrently deposited from aqueous solution using vacuum filtration through a nanoporous membrane. The surfactants that enable SWNT and platinum nanoparticle dispersion in aqueous solution are removed via a straightforward rinsing procedure, thus resulting in an interconnected, porous network of SWNTs and platinum nanoparticles. In an effort to verify that residual surfactants do not compromise the electronic coupling between the SWNTs and the platinum nanoparticles, extensive characterization of these nanocomposite films is undertaken including X-ray diffraction, electron microscopy, optical spectroscopy, Raman spectroscopy, electrical conductivity measurements, and cyclic voltammetry. These nanocomposite films are also shown to be catalytically active and sensitive to hydrogen, which indicates their use in fuel cells, catalysts, and chemical sensors. While the focus in this example is on SWNTs and platinum nanoparticles, the vacuum filtration technique can likely be utilized for the formation of multifunctional nanocomposite films that contain nearly limitless combinations of solution-dispersed nanoparticles, nanotubes, nanowires, and macromolecules.

Experimental Details

Commercially available SWNTs enriched in the (6,5) chirality with 0.76 nm diameter (SG65, SWeNT) were used throughout this study. The SWNTs are dispersed in 1% sodium dodecyl sulfate (SDS) surfactant aqueous solution using a standard dispersion procedure that consists of sonication and centrifugation [33]. Potassium tetrachloroplatinate (99.9% purity, Sigma Aldrich), 1 mM in 0.2% SDS aqueous solution, is aged for one day and subsequently reduced with a stoichiometric amount of 100 mM (dimethylamino)borane (DMAB, Fluka). During reduction, DMAB is pipetted in five aliquots every one minute while stirred continuously at room temperature to ensure uniform platinum nanoparticle growth. For all nanocomposite and control films, 200 µL of SWNT solution, and different volumes (0, 100 µL, 200 µL, 400 µL, and 800 µL) of platinum nanoparticle dispersion are diluted with 5 ml of 0.5% sodium cholate and passed through nanoporous membranes using vacuum filtration. Two sets of the same compositions are made, one set on mixed cellulose esters (MCE) membranes (50 nm pore size, Millipore) and the other set on anodized alumina (AA) membranes (20 nm pore size, Anodisc 25, Whatman). The films are labeled by the amount of platinum; i.e., SWNT and SWNT/Pt (0.1 µmol, 0.2 µmol, 0.4 µmol, or 0.8 µmol). Immediately after vacuum filtration, 15 mL of deionized water is passed through the membrane to rinse out any remaining surfactant. The film area of 2.5 $cm^2$ is determined by the vacuum filtration funnel.

All characterization experiments are performed on each of the 5 films after the original samples were cut into quarters of 0.625 $cm^2$ surface area with the exception of X-ray diffraction (XRD), which is measured on a film made by vacuum filtration of 0.2 mL of SWNT solution followed by 0.4 mL of platinum nanoparticle dispersion.

XRD is performed using a Scintag XDS2000 diffractometer, where the background obtained from a pristine AA disc is subtracted from the data. A Hitachi S-4800-II scanning electron microscope (SEM) is used to image nanocomposites on AA membranes with a 3-5 kV accelerating voltage and 10 µA beam current under various magnifications. Films are electrically contacted from the top to the SEM holder using copper tape. For optical spectroscopy experiments, a transfer of the MCE membrane nanocomposites to an optically transparent glass slide is accomplished using a slightly modified procedure originally developed for SWNT transparent conductive films [34]. In particular, a piece of each of the nanocomposite films on MCE membranes is placed on a glass slide top side down, wetted with isopropanol, and exposed to acetone vapor. After initial attachment, the remaining MCE is dissolved by immersing in acetone for one hour. Films are then washed with acetone and dried slowly. Optical transmittance spectra are measured with a Cary 500 spectrophotometer (Varian) in the visible and near-infrared spectral regions. Raman vibrational spectra are tested for all nanocomposite films on AA membranes, and for SWNT and SWNT/Pt (0.8 µmol) solutions. A TriVista Raman system (Acton) with laser excitation of 568.2 nm from an Ar—Kr gas laser (Stabilite, Spectra-Physics) is used in the microscope configuration. The optical power at the sample is measured to be 6 mW. No laser-induced damage was observed during the measurements. For hydrogen exposure measurements, Raman spectra are taken several times before and after running a 5% $H_2$, 95% Ar gas mixture for two minutes over the sample. The sheet resistance of the nanocomposite films on glass and AA membranes is measured with a four point probe technique with an electrode separation of 1 mm using a Keithley 2400 sourcemeter. A bias of 0.3 V is supplied and the current evolution in time is measured during hydrogen (5% $H_2$, 95% Ar) gas exposure. Cyclic voltammetry is performed using a CHI750C potentiostat (CH Instruments) on nanocomposite films on AA membranes. The samples are placed in a teflon holder with a stainless steel foil electrical contact. The film is wetted through a hole in the holder of surface area 0.2 $cm^2$ and serves as a working electrode. Along with the working electrode, a reference calomel (Ag/AgCl in 1 M KCl) and counter electrode (Pt wire) are placed in 6 mL of 0.3 M sulfuric acid that is deoxygenated by nitrogen gas. Electrode activation is achieved by biasing for several cycles until steady state is achieved. The cyclic voltammetry scan rate is 10 mV/s.

Results and Implications

Figure 1:
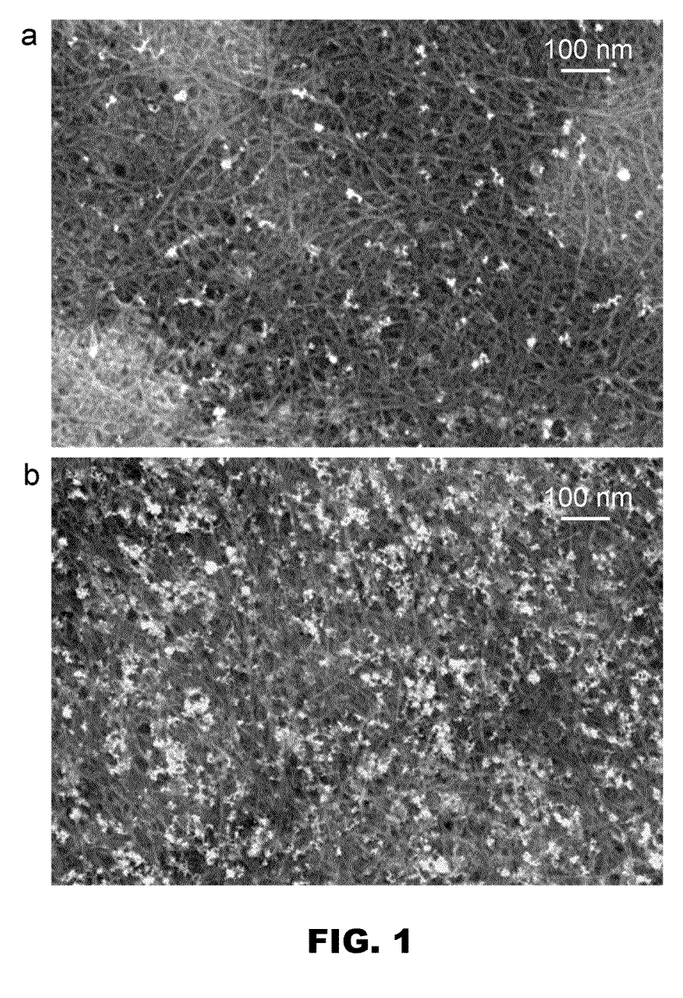
FIG. 1 shows scanning electron microscope images of nanocomposite films consisting of SWNTs and platinum nanoparticles: (a) 0.2 μmol SWNT/Pt and (b) 0.8 μmol SWNT/Pt, according to one embodiment of the present invention.
Figure 2:
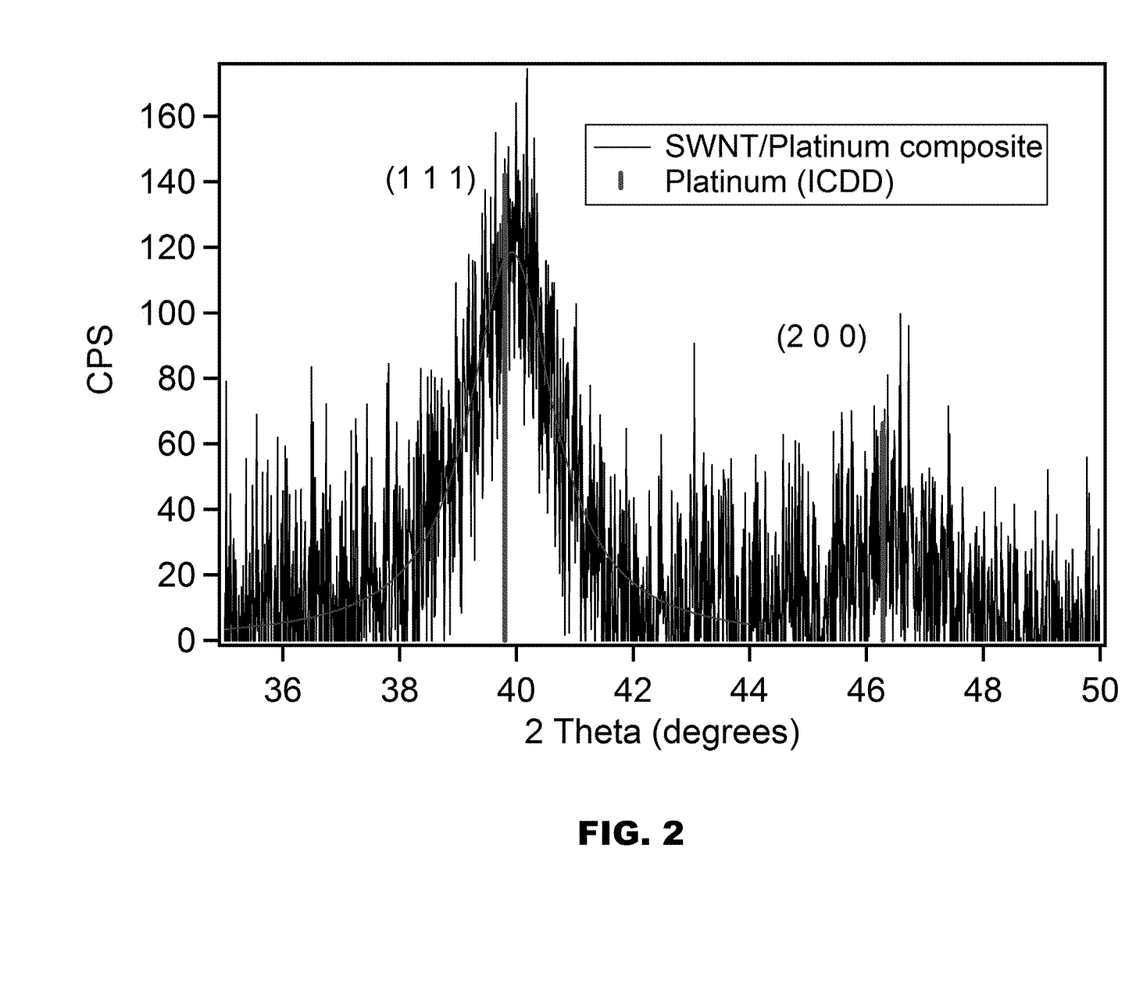
FIG. 2 shows an X-ray diffraction spectrum of platinum nanoparticles deposited by vacuum filtration on top of a SWNT film (CPS=counts per second), according to one embodiment of the present invention. The width of the dominant (1 1 1) peak is used in the Scherrer equation to obtain a 4.8 nm platinum nanoparticle diameter. For comparison purposes, the scaled scattering intensity of platinum from the ICDD database is also shown.

In an effort to characterize the film morphology, the nanocomposites are first examined with scanning electron microscopy (SEM). SEM images at 100 k magnification of 0.2 µmol SWNT/Pt (FIG. 1a) and 0.8 µmol SWNT/Pt (FIG. 1b) show an increasing number of platinum nanoparticles with increasing platinum content. Platinum nanoparticles are seen both on top and within the SWNT network, where they appear less bright but are distinguishable because of their distinct shape. This three-dimensional nature of the SWNT/Pt nanocomposite represents an advantage compared to electrodeposition and other surface deposition techniques especially in applications such as fuel cells and catalysts. Individual platinum nanoparticles have diameters comparable to the SWNTs, in accordance with the 4.8 nm platinum nanoparticle diameter value obtained from XRD measurements (FIG. 2). Although larger platinum clusters are also observed, these aggregates mostly follow the SWNT fiber geometry, thus it is reasonable to assume that they are composed of loosely bound small diameter platinum nanoparticles.

Figure 3:
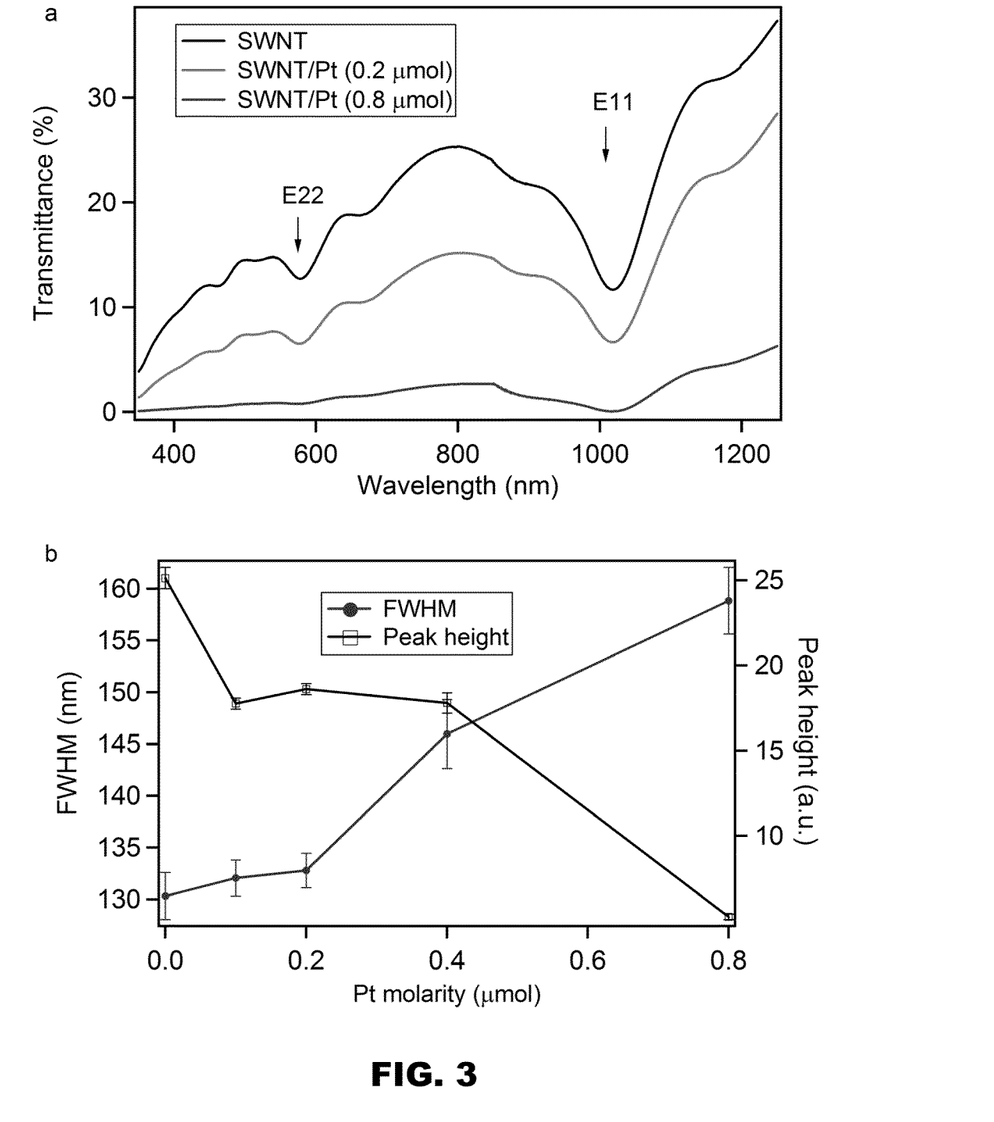
FIG. 3 shows (a) optical transmittance of SWNT/Pt nanocomposite films on glass according to one embodiment of the present invention. The E11 and E22 optical transitions of the (6,5) SWNT chirality are explicitly labeled, and (b) The full-width at half-maximum (FWHM) and peak height are obtained by Gaussian fitting of the E11 peak at 1016 nm and are plotted with respect to the platinum content.

Optical spectroscopy allows for interrogation of the electronic and optical properties of the nanocomposite films. In particular, SWNTs of distinct chiralities have different electronic transitions that are influenced by surface interactions with the platinum nanoparticles and neighboring SWNTs. The lowest order electronic transitions (E11) of the semiconducting SWNTs are due to excitonic absorption and are sensitive to the dielectric environment surrounding the SWNTs. SWNT bundling in films and powders results in a broadening and redshift of the E11 peaks first, and then the E22 peaks, due to electronic interactions between contacting SWNTs. Similar effects are observed when the SWNTs are in contact with metallic nanoparticles; e.g., the E11 peak quenches completely when metallic nanoparticles are distributed along the SWNT surface with an inter-nanoparticle spacing less than the exciton mean free path [27]. Consequently, optical transmission spectra of the nanocomposite films on glass are measured to estimate the electronic interactions between the platinum nanoparticles and the SWNTs (FIG. 3a). As expected, the optical transmittance of the films decreases with increasing platinum concentration. In addition, the E11 peak at 1016 nm is broadened and attenuated with increasing platinum concentration (FIG. 3b). These results confirm strong electronic coupling between the platinum nanoparticles and the SWNTs. Furthermore, the distinct decrease in peak height and increase in peak width of the 0.8 μmol SWNT/Pt nanocomposite suggests that the platinum nanoparticles possess an inter-nanoparticle spacing that is less than the exciton mean free path (50 nm) [35]. This conclusion is consistent with the aforementioned SEM imaging (FIG. 1b).

Figure 4:
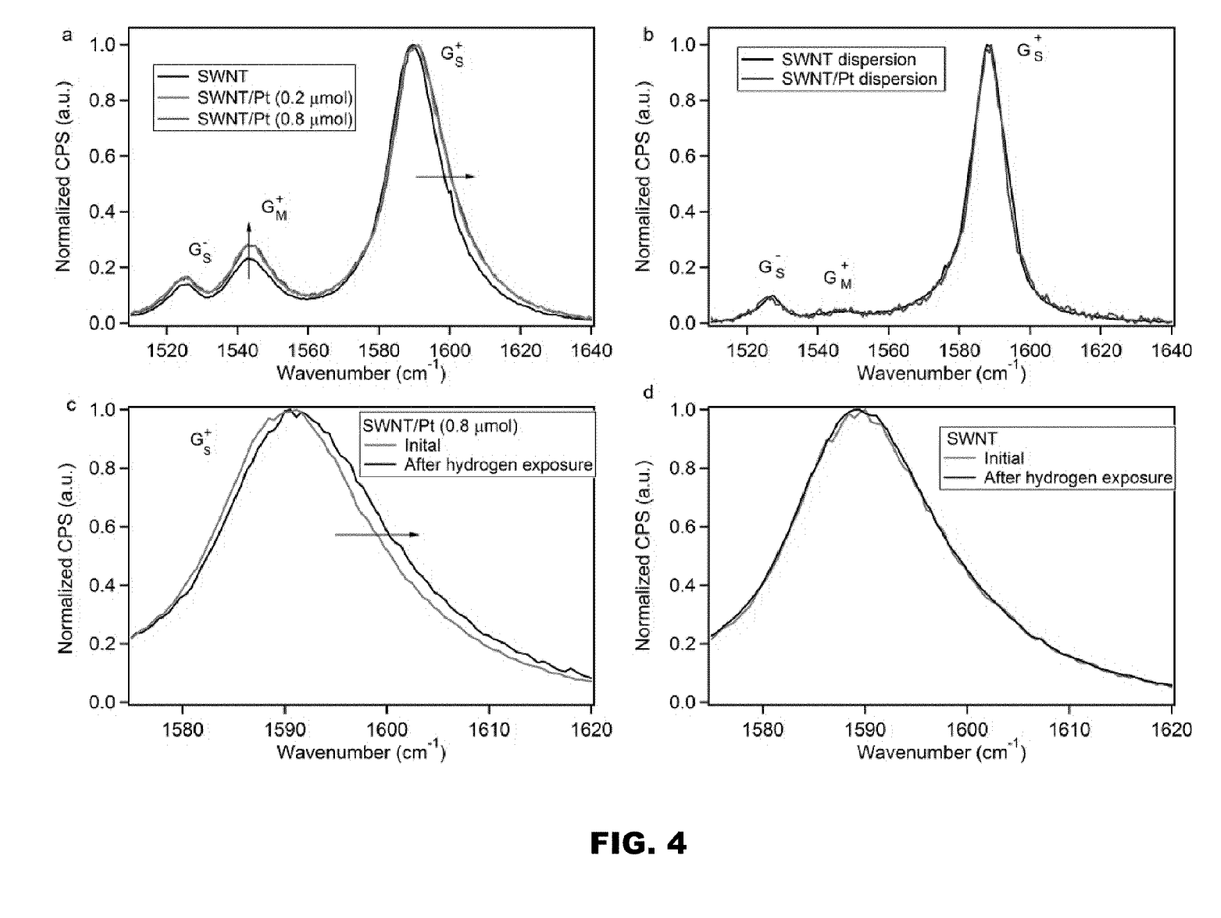
Figure 5:
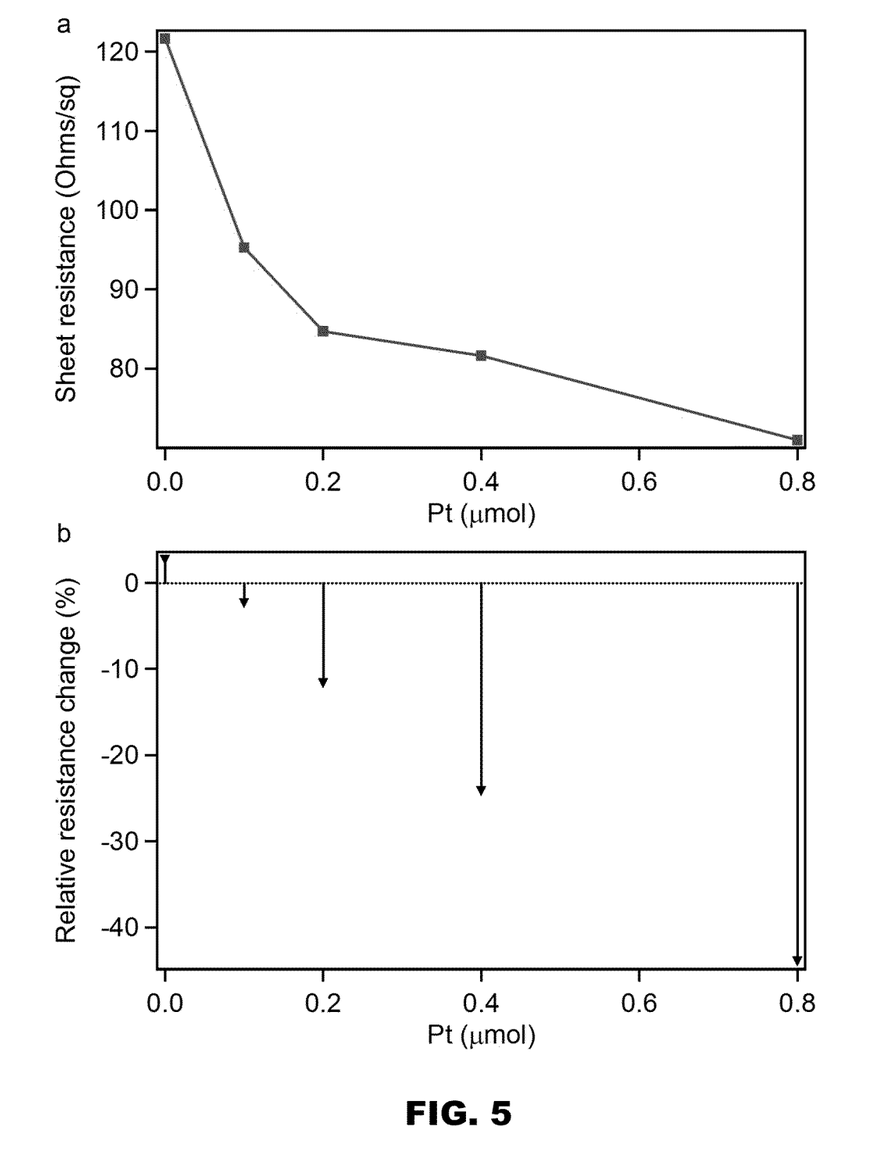
FIG. 5 shows (a) four-point probe sheet resistance as a function of platinum content for SWNT/Pt films on anodized alumina membranes, and (b) relative sheet resistance change of SWNT/Pt films on glass after exposure to hydrogen, according to one embodiment of the present invention.

Vibrational spectra of the nanocomposite films are measured using Raman spectroscopy. The excitation wavelength (568.2 nm) is set to predominantly excite semiconducting chiralities, and in particular the prevailing (6,5) species. In FIG. 4, the G band region (1500-1600 cm$^{-1}$) that consists of vibrational modes in the longitudinal (G$^+$) and circumferential graphene plane (G$^-$) is shown. To quantify the relative intensities of different G band modes, the spectra are normalized to the G$_S^+$ peak. For the case of well separated SWNTs as is found in surfactant solution (FIG. 4b), the G band vibrations of semiconducting SWNTs are clearly present while the vibrational spectrum of metallic species is diminished, as expected by the choice of excitation wavelength. This situation is changed for SWNT films (FIG. 4a). In particular, metallic chiralities with E22 optical transitions that are not in resonance with the excitation wavelength are excited via electronic coupling to optically excited semiconducting SWNTs, as is observed by the increased G$_M^+$ mode [36]. For the SWNT/Pt nanocomposite films, the G$_M^-$ peak is further enhanced, which suggests better electronic coupling when the platinum nanoparticles are present. This conclusion is further supported by macroscopic sheet resistance measurements that reveal decreasing sheet resistance with increasing platinum content (FIG. 5a).

Since platinum is known to catalyze H$_2$ decomposition into atomic H, the catalytic properties of the nanocomposite films are tested through exposure to hydrogen gas. For example, Raman spectra are recorded before and after two minutes exposure to 5% hydrogen gas. As seen in FIG. 4c, molecular hydrogen exposure produces a shift of the G$_S^+$ peak for the SWNT/Pt (0.8 μmol) nanocomposite, in contrast with the SWNT film (FIG. 4d). Since the position of the G$_S^+$ peak is known to be associated with Fermi level shifts, the atomic hydrogen species induced by the platinum nanoparticles appear to be doping the SWNT [37, 38].

Figure 6:
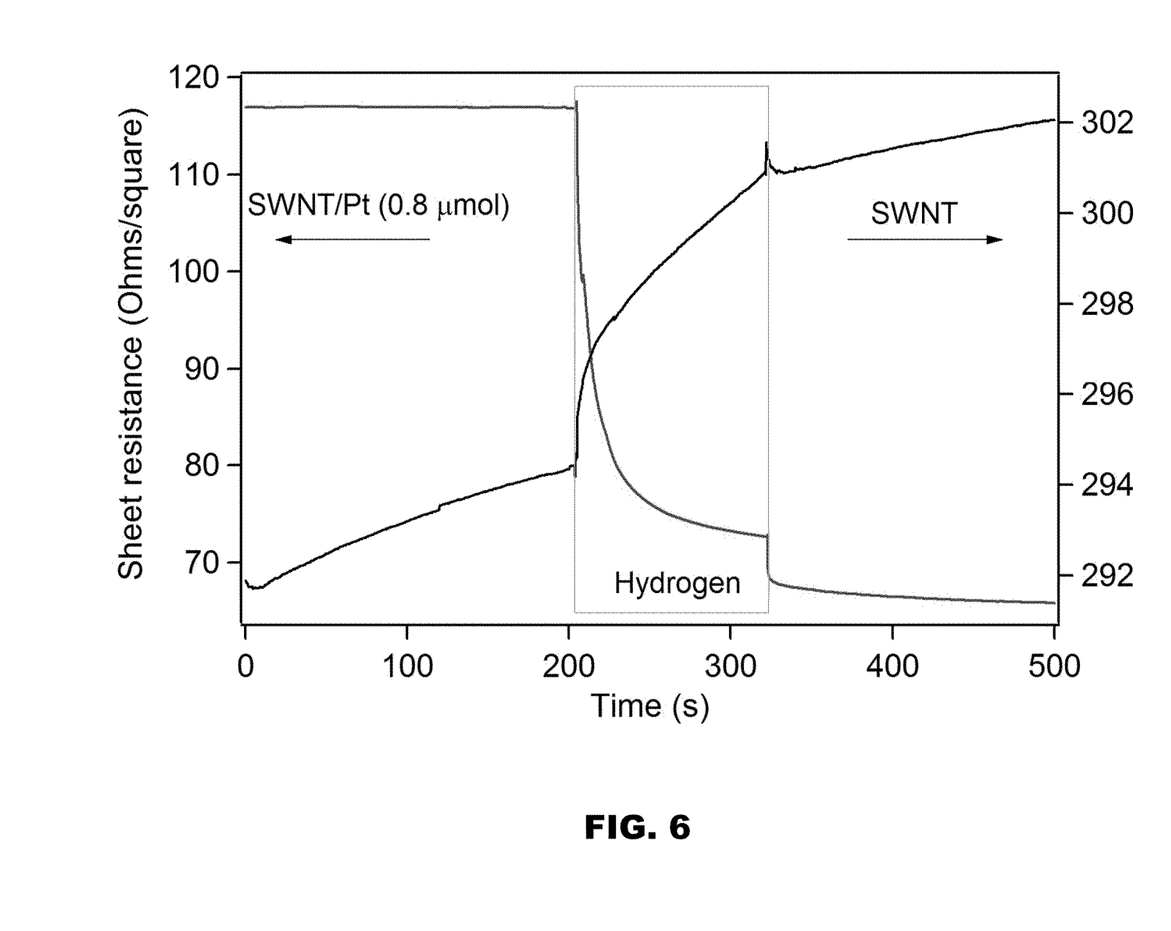
FIG. 6 shows sheet resistance change of SWNT and SWNT/Pt (0.8 μmol) films on glass upon introduction of 5% hydrogen gas, according to one embodiment of the present invention.

Electrical conductivity is measured by via the four point probe technique. The average sheet resistance is plotted with respect to platinum content (FIG. 5a). A clear decrease of sheet resistance with increasing platinum content is observed, suggesting that the Pt nanoparticles yield improved electrical contact between the SWNTs. This interpretation is in agreement with SEM, optical spectroscopy, and Raman spectroscopy measurements. The sensitivity of the Pt/SWNT nanocomposite films to hydrogen is measured by monitoring the time evolution of the electrical current through the film during exposure to 5% hydrogen gas. For the SWNT film with no platinum, only a slight (2.7%) current decrease is observed during hydrogen exposure (FIG. 6). This subtle effect can be attributed to the removal of loosely bound oxygen on the SWNT surface that provides p-type doping of the semiconducting SWNTs in air. In contrast, the SWNT/Pt (0.8 μmol) film exhibits a substantial (44%) current increase, which likely results from doping induced by platinum-catalyzed atomic hydrogen. The relative resistance drop for the SWNT/Pt nanocomposites increases with platinum content (FIG. 5b).

Figure 7:
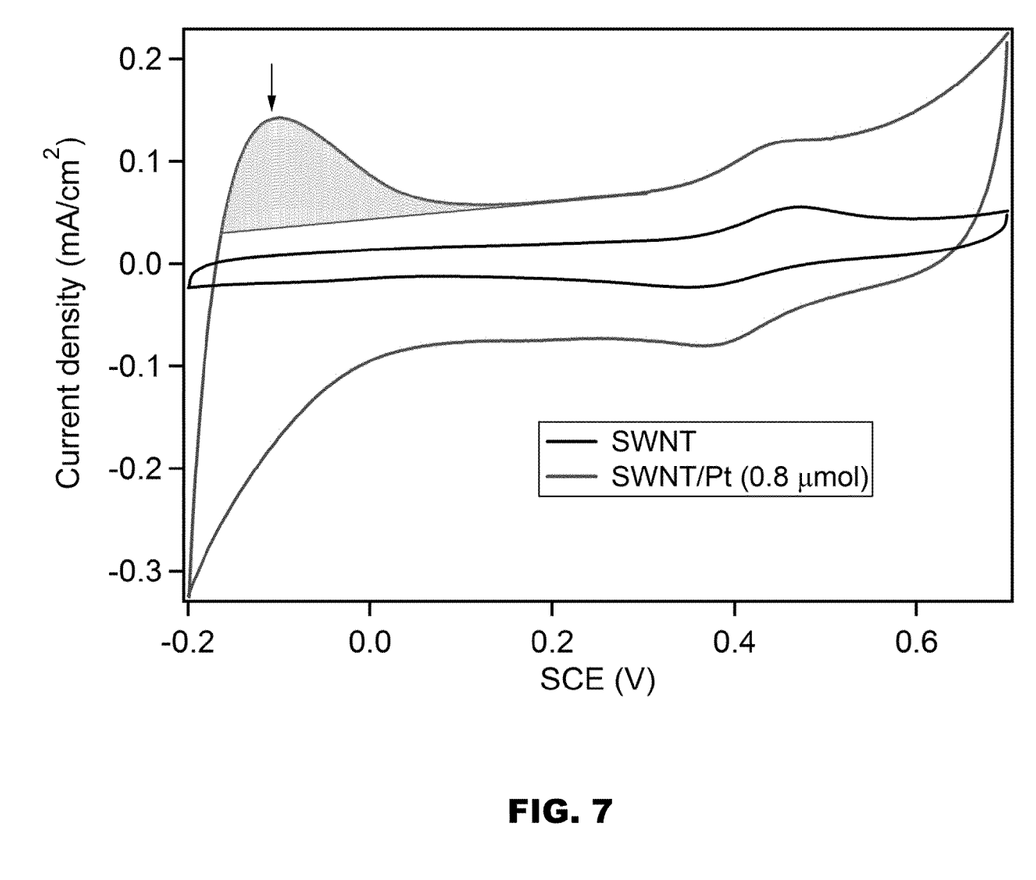
FIG. 7 shows current density of SWNT and SWNT/Pt (0.8 μmol) films obtained by cyclic voltammetry in 0.3 M sulfuric acid (SCE=saturated calomel electrode) according to one embodiment of the present invention. The peak attributed to hydrogen adsorption on platinum is denoted by an arrow. The shaded area for the SWNT/Pt nanocomposite film is used to calculate the electrochemically active surface area (23.6 $m^2/g$).

The electrocatalytic activity of the SWNT/Pt nanocomposites are tested by cyclic voltammetry (FIG. 7). For potentials exceeding 0.4 V, the peaks involving hydroxyl reactions show similar performance for both the SWNT and SWNT/Pt nanocomposite films, while the double-layer current rises for the SWNT/Pt nanocomposite presumably due to the increase of film thickness. In contrast, the peak near −0.1 V that describes hydrogen adsorption rises with the addition of platinum. The active surface area of the platinum can be calculated by comparing the charge involved during hydrogen reaction (shaded area in FIG. 7) to the known charge per unit area for platinum (210 μC/cm$^2$). From this calculation, the electrochemically active surface area for the SWNT/Pt (0.8 μmols) nanocomposite is 23.6 m$^2$/g, which is much larger than the value for bulk platinum (2.8 m$^2$/g) and comparable to previous reports for carbon-supported platinum [10]. Taking into account the average platinum nanoparticle diameter and the total platinum surface area (8.75 cm$^2$), 42% of the platinum nanoparticle surface area is catalytically active.

Example 2

Use of Platinum-CNT Nanocomposites as a Cathode in Dye-Sensitized Solar Cells

Figure 8:
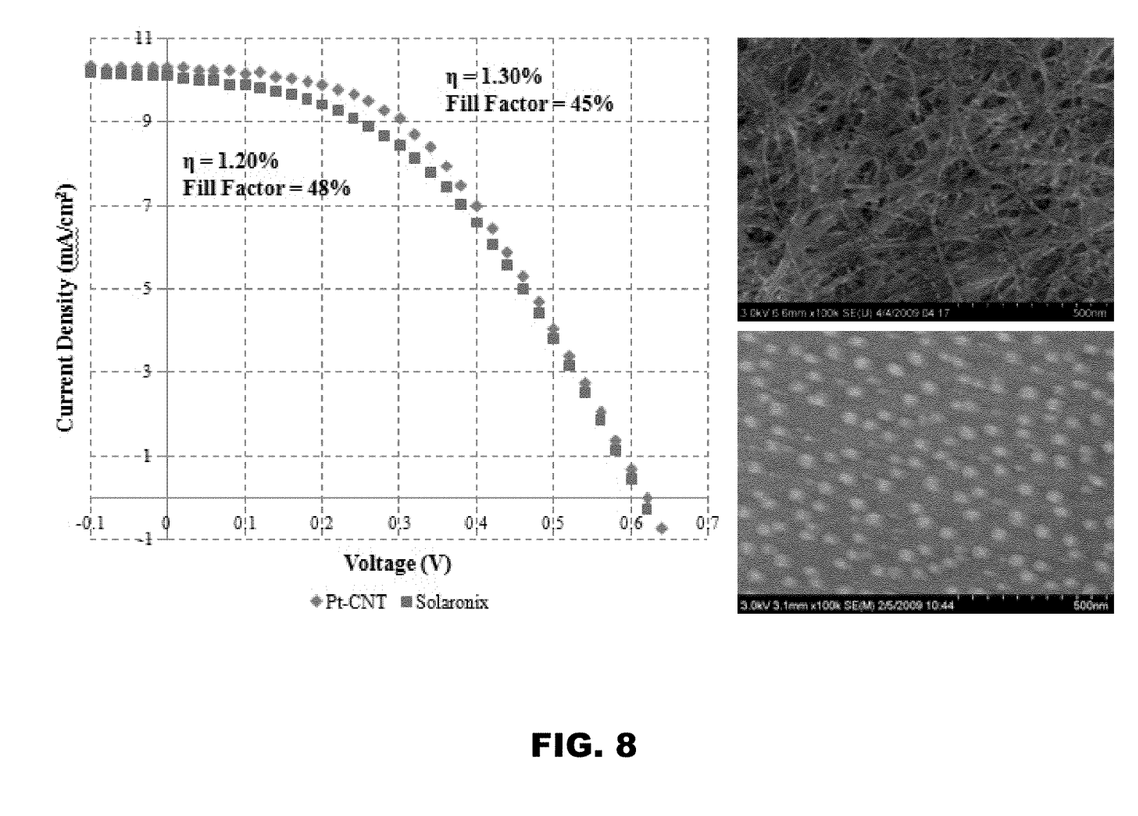
FIG. 8 shows (left) a comparison of solar cell performance with cathodes fabricated from commercial Platisol T from Solaronix (red) and Pt-SWNT nanocomposites (blue) according to one embodiment of the present invention; and (right) SEM images of the two electrodes: nanocomposite Pt-SWNT according to one embodiment of the present invention (top) and commercially available Platisol (bottom).

In another embodiment of the present invention, the film of nanocomposites of CNTs and Pt nanoparticles made by the method described in Example 1 or a method similar to it [39] was tested for possible use as a cathode in dye-sensitized solar cells (DSSCs). DSSCs were made using commercially available dyes and protocol developed by Solaronix. Pt/SWNT nanocomposite thin film electrodes were compared to standard cathodes fabricated from Solaronix Platisol T platinum precursor. The anode configuration and electrolyte were held constant in both cases. DSSCs made with the Pt-SWNT nanocomposite electrode show about 10% improvement in efficiency (FIG. 8, left). Scanning electron microscope (SEM) images (FIG. 8, right) of the electrodes show that the Pt nanoparticles in the Pt-SWNT nanocomposite electrode are sub-10 nm sized compared to the much larger platinum particles resulting from the Platisol precursor. The smaller nanoparticle size of the nanocomposite electrode results in larger available catalytic area, thus contributing to the higher observed efficiency.

Example 3

TiO$_2$-CNT Nanocomposites

It has been established [40] that the addition of SWNTs to titanium dioxide (TiO$_2$) improves photocatalytic activity via two distinct mechanisms. First, the SWNTs extract electrons from excitons generated by light absorption in TiO$_2$, ensuring longer carrier lifetimes and improved catalytic activity. Second, SWNTs decrease the optical bandgap, thus enabling absorption of light at longer wavelengths and enabling enhanced reactivity with visible illumination.

In yet another embodiment of the present invention, nanocomposites were fabricated from commercially available anatase (25 nm diameter spherical) and rutile (40 nm diameter×100 nm long cylindrical) $TiO_2$ nanoparticles (Sigma), and CoMoCAT SWNTs (SWeNT). Both materials were suspended in sodium dodecyl sulfate (SDS) via sonication with a density of 0.5 mg/ml and 1 mg/ml respectively. Thin films were made from a 5 to 1 mass ratio of $TiO_2$ to SWNTs by vacuum filtration onto 200 nm pore anodisc membranes. The catalytic activity of the nanocomposites was determined from the decomposition of Methylene Blue dye, which was monitored through the decrease of the dye optical absorption upon exposure to either UV (367 nm) or visible light (514 nm). Nanocomposites showed a 2 to 4 fold improvement in catalytic activity when compared to control films fabricated from the same amount of $TiO_2$. In addition, unlike pure $TiO_2$ films, $TiO_2$-SWNT films are electrically conductive, and the resistance can be modulated by UV light exposure.

Example 4

Silicon-Graphene-CNT Nanocomposites

Lithium-ion batteries are used in the majority of portable electronics due to their high specific capacity. However, efforts to extend their use in more demanding applications such as electric cars require increases in lithiation efficiency and reductions in weight. Commercially manufactured lithium-ion battery anodes fabricated from graphite have a gravimetric lithiation capacity of 372 mA·hr/g. Silicon (Si) has an order of magnitude larger capacity (4200 mA·hr/g), however the large volumetric expansion and contraction during cycling (300%) results in cracks and reduces electrical conductivity. Recently, one-dimensional materials such as Si wires [41] and carbon nanotubes [42] have been tested to maintain structural and electrical stability during cycling.

Figure 9:
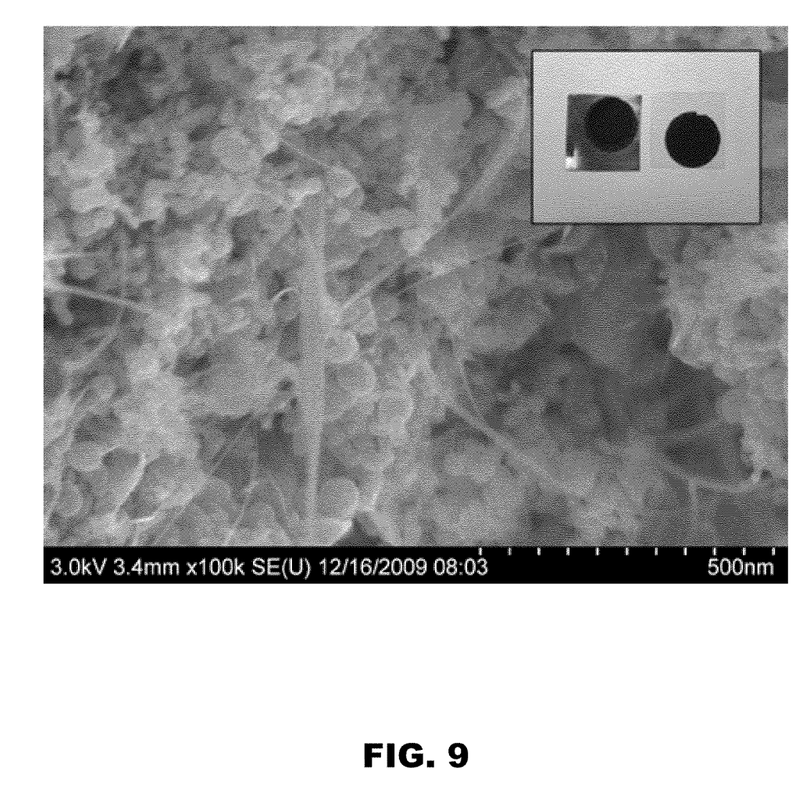
FIG. 9 shows a cross-sectional SEM image of a SiNP-graphene-SWNT anode according to one embodiment of the present invention. The inset shows SiNP-graphene-SWNT films on copper and polyethylene terephthalate (PET) plastic films according to one embodiment of the present invention.
Figure 10:
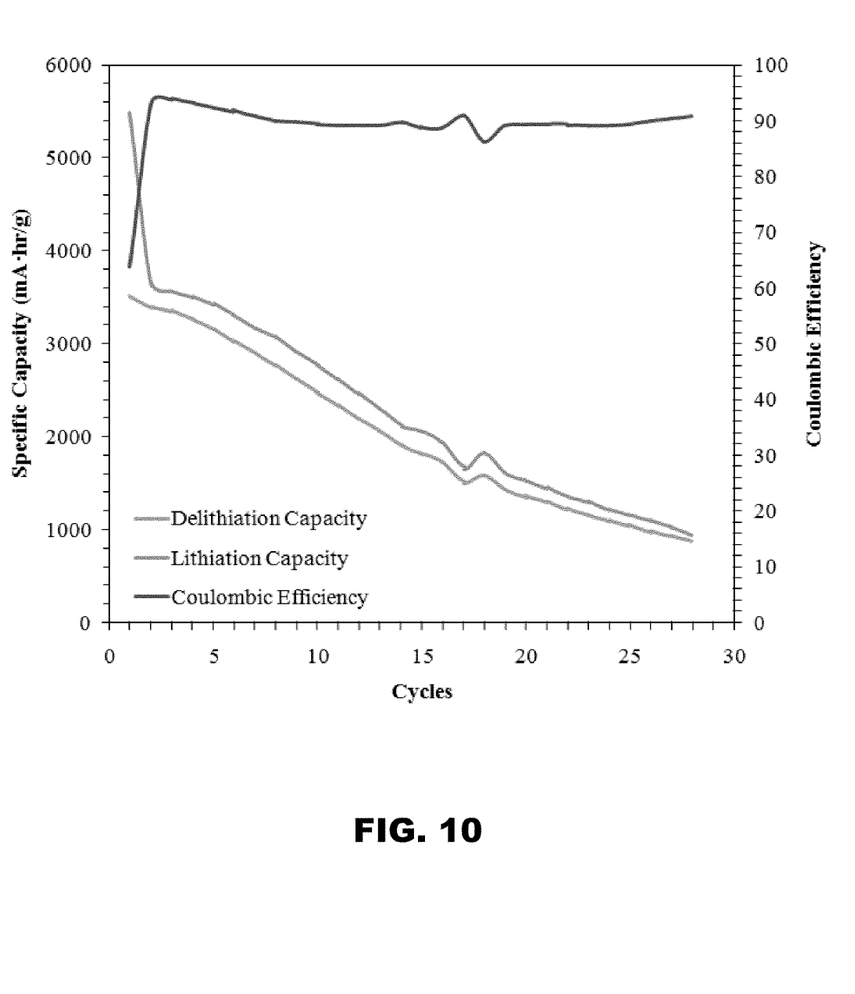
FIG. 10 shows lithiation capacity and coulombic efficiency of a SiNP-graphene-SWNT film anode over multiple cycles according to one embodiment of the present invention.

In a further embodiment of the present invention, nanocomposites were made from commercial Si nanoparticles (Meliorum Technologies), solvent exfoliated graphene (Asbury Carbon), and P2 SWNTs (Carbon Solutions) in 40 to 10 to 1 mass ratio by vacuum filtration through 200 nm pore anodisc membranes. As determined by x-ray diffraction, Si nanoparticles have a mean particle size of approximately 26 nm. Si nanoparticles are suspended in SDS via ball milling (0.2 mg/mL) before co-deposition with N,N dimethyl formamide suspended graphene and SWNTs. The filtered Si-graphene-SWNT films are then lifted and transferred to copper substrates. SEM images show uniform distribution of SWNTs between Si nanoparticles and graphene flakes (FIG. 9). Due to surface chemical reactions, initial charging of the composite Si-graphene-SWNT electrode results in a high initial capacity (FIG. 10). However, the nanocomposite (similar to other Si-SWNT electrodes) exhibits the same initial irreversible lithium loss due to Li-SWNT interaction [42]. Additional cycling improvements can be achieved through battery binder optimization and chemical vapor deposition.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope.

LIST OF REFERENCES

[1] Lewis N S and Nocera D G 2006 *Proc. Natl. Acad. Sci. U.S.A.* 103 15729
[2] Gomez-Romero P 2001 *Adv. Mater.* 13 163
[3] Kamat P V 2007 *J. Phys. Chem. C* 111 2834
[4] Gratzel M 2005 *Chem. Lett.* 34 8
[5] Oregan B and Gratzel M 1991 *Nature* 353 737
[6] Guo D J and Li H L 2004 *J. Electroanal. Chem.* 573 197
[7] Li W Z, Liang C H, Zhou W J, Qiu J S, Zhou Z H, Sun G Q and Xin Q 2003 *J. Phys. Chem. B* 107 6292
[8] Kaempgen M, Lebert M, Nicoloso N and Roth S 2008 *Appl. Phys. Lett.* 92 94103
[9] Girishkumar G, Hall T D, Vinodgopal K and Kamat P V 2006 *J. Phys. Chem. B* 110 107
[10] Girishkumar G, Rettker M, Underhile R, Binz D, Vinodgopal K, McGinn P and Kamat P 2005 *Langmuir* 21 8487
[11] Girishkumar G, Vinodgopal K and Kamat P V 2004 *J. Phys. Chem. B* 108 19960
[12] Kim Y T and Mitani T 2006 *J. Catal.* 238 394
[13] Lee K, Zhang J J, Wang H J and Wilkinson D P 2006 *J. Appl. Electrochem.* 36 507
[14] Lin Y H, Cui X L, Yen C H and Wai C M 2005 *Langmuir* 21 11474
[15] Liu H S, Song C J, Zhang L, Zhang J J, Wang H J and Wilkinson D P 2006 *J. Power Sources* 155 95
[16] Matsumoto T, Komatsu T, Arai K, Yamazaki T, Kijima M, Shimizu H, Takasawa Y and Nakamura J 2004 *Chem. Commun.* 840
[17] Mu Y Y, Liang H P, Hu J S, Jiang L and Wan L J 2005 *J. Phys. Chem. B* 109 22212
[18] Nagle L C and Rohan J F 2008 *J. Power Sources* 185 411
[19] Tang H, Chen J H, Huang Z P, Wang D Z, Ren Z F, Nie L H, Kuang Y F and Yao S Z 2004 *Carbon* 42 191
[20] Tian Z Q, Jiang S P, Liang Y M and Shen P K 2006 *J. Phys. Chem. B* 110 5343
[21] Wang C, Waje M, Wang X, Tang J M, Haddon R C and Yan Y S 2004 *Nano Lett.* 4 345
[22] Xing Y C 2004 *J. Phys. Chem. B* 108 19255
[23] Yao Y L, Ding Y, Ye L S and Xia X H 2006 *Carbon* 44 61
[24] Narayanamoorthy J, Durairaj S, Song Y, Xu Y and Choi J 2007 *Appl. Phys. Lett.* 90 63112
[25] Xie J N, Zhang N Y and Varadan V K 2003 *SPIE International Symposium on Microelectronics, MEMS and Nanotechnology*, (Perth, AUSTRALIA) pp S5
[26] Kongkanand A, Vinodgopal K, Kuwabata S and Kamat P V 2006 *J. Phys. Chem. B* 110 16185
[27] Ostojic G N, Ireland J R and Hersam M C 2008 *Langmuir* 24 9784
[28] Day T M, Unwin P R, Wilson N R and Macpherson J V 2005 *J. Am. Chem. Soc.* 127 10639
[29] Day T M, Unwin P R and Macpherson J V 2007 *Nano Lett.* 7 51
[30] Ren G Q and Xing Y C 2006 *Nanotechnology* 17 5596
[31] Bittencourt C, Hecq M, Felten A, Pireaux J J, Ghijsen J, Felicissimo M P, Rudolf P, Drube W, Ke X and Van Tendeloo G 2008 *Chem. Phys. Lett.* 462 260
[32] Kim S J, Park Y J, Ra E J, Kim K K, An K H, Lee Y H, Choi J Y, Park C H, Doo S K, Park M H and Yang C W 2007 *Appl. Phys. Lett.* 90 23114

[33] O'Connell M J, Bachilo S M, Huffman C B, Moore V C, Strano M S, Haroz E H, Rialon K L, Boul P J, Noon W H, Kittrell C, Ma J P, Hauge R H, Weisman R B and Smalley R E 2002 *Science* 297 593

[34] Green A A and Hersam M C 2008 *Nano Lett.* 8 1417

[35] Sundqvist P A, Garcia-Vidal F J and Flores F 2008 *Phys. Rev. B* 78 205427

[36] Chou S G, Ribeiro H B, Barros E B, Santos A P, Nezich D, Samsonidze G G, Fantini C, Pimenta M A, Jorio A, Plentz F, Dresselhaus M S, Dresselhaus G, Saito R, Zheng M, Onoa G B, Semke E D, Swan A K, Unlu M S and Goldberg B B 2004 *Chem. Phys. Lett.* 397 296

[37] Das A, Sood A K, Govindaraj A, Saitta A M, Lazzeri M, Mauri F and Rao C N R 2007 *Phys. Rev. Lett.* 99 136803

[38] Nguyen K T, Gaur A and Shim M 2007 *Phys. Rev. Lett.* 98 145504

[39] Ostojic et al., *Nanotechnology*, 2009, 20, 434019.

[40] Woan et al., *Adv. Mater.* 2009, 21, 2233.

[41] Park et al., *Nano Lett.* 2009, 9, 3844.

[42] Cui et al., *ACS Nano* 2010, 4, 3671.

What is claimed is:

1. A method, comprising the steps of:
   (a) providing a first solution that contains a plurality of carbon nanotubes (CNTs);
   (b) providing a second solution that contains a plurality of platinum (Pt) nanoparticles;
   (c) combining the first solution and the second solution to form a third solution; and
   (d) filtering the third solution through a nanoporous membrane using vacuum filtration to obtain a film of nanocomposites of CNTs and Pt nanoparticles,
   wherein the step of providing the second solution comprises the steps of:
      dispersing a first amount of potassium tetrachloroplatinate ($K_2PtCl_4$) in 0.2% SDS to form a fourth solution; and
      reducing the first amount of $K_2PtCl_4$ in the fourth solution with a second amount of (dimethylamino)borane (DMAB) to form the plurality of Pt nanoparticles.

2. The method of claim 1, further comprising the step of rinsing the film of nanocomposites of CNTs and Pt nanoparticles after the filtering step.

3. The method of claim 1, wherein the third solution is diluted with 0.5% sodium cholate prior to the filtering step.

4. The method of claim 1, wherein the nanoporous membrane is a mixed cellulose ester (MCE) membrane.

5. The method of claim 4, wherein the MCE membrane has a pore size of about 50 nm.

6. The method of claim 1, wherein the nanoporous membrane is an anodized alumina membrane.

7. The method of claim 6, wherein the anodized alumina membrane has a pore size of about 20 nm.

8. The method of claim 1, wherein the plurality of CNTs comprises single-walled carbon nanotubes (SWNTs).

9. The method of claim 8, wherein the SWNTs have (6,5) chirality and have a diameter of about 0.76 nm.

10. The method of claim 1, wherein the first solution comprises CNTs dispersed in 1% sodium dodecyl sulfate (SDS).

11. The method of claim 1, wherein the fourth solution is aged for about one day prior to the reducing step.

12. The method of claim 1, wherein the molar ratio of the first amount of $K_2PtCl_4$ and the second amount of DMAB is about 1:100.

13. The method of claim 12, wherein the reducing step comprises pipetting about five aliquots of DMAB every one minute into the fourth solution while stirring the fourth solution continuously at room temperature.

14. The method of claim 1, wherein the film of nanocomposites of CNTs and Pt nanoparticles comprises Pt nanoparticles of about 4.8 nm diameter.

15. The method of claim 1, wherein the film of nanocomposites of CNTs and Pt nanoparticles has a Pt concentration ranging from about 0.05 μmol to about 1 μmol.

16. The method of claim 15, wherein the film of nanocomposites of CNTs and Pt nanoparticles has a Pt concentration of about 0.8 μmol and an inter-Pt-nanoparticle spacing that is less than about 50 nm.

17. The method of claim 16, wherein the film of nanocomposites of CNTs and Pt nanoparticles has an average electrochemically active Pt surface area per gram of about 23.6 $m^2/g$.

18. The method of claim 17, wherein about 42% of the Pt nanoparticle surface area in the film of nanocomposites of CNTs and Pt nanoparticles is electrochemically active.

* * * * *